(12) United States Patent
Nagatani et al.

(10) Patent No.: US 8,571,495 B2
(45) Date of Patent: Oct. 29, 2013

(54) DISTORTION COMPENSATION APPARATUS AND METHOD

(75) Inventors: Kazuo Nagatani, Kawasaki (JP); Yuichi Utsunomiya, Kawasaki (JP); Hajime Hamada, Kawasaki (JP); Hiroyoshi Ishikawa, Kawasaki (JP); Nobukazu Fudaba, Kawasaki (JP); Shohei Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 723 days.

(21) Appl. No.: 12/701,923

(22) Filed: Feb. 8, 2010

(65) Prior Publication Data

US 2010/0219889 A1    Sep. 2, 2010

(30) Foreign Application Priority Data

Mar. 2, 2009    (JP) .................................. 2009-47911

(51) Int. Cl.
*H04B 1/04*    (2006.01)
*H01Q 11/12*   (2006.01)

(52) U.S. Cl.
USPC ..................... 455/114.3; 455/126; 455/127.2; 375/297; 330/136; 330/149

(58) Field of Classification Search
USPC ............ 455/63.1, 67.11, 67.13, 114.2, 114.3, 455/115.1, 115.3, 126, 127.2; 375/296, 375/297; 330/129, 136, 149
See application file for complete search history.

(56) References Cited

U.S. PATENT DOCUMENTS

| | | | | |
|---|---|---|---|---|
| 5,903,823 | A * | 5/1999 | Moriyama et al. ............ | 455/126 |
| 6,246,286 | B1 * | 6/2001 | Persson ......................... | 330/149 |
| 6,717,464 | B2 * | 4/2004 | Fudaba et al. ................ | 330/149 |
| 6,744,315 | B2 * | 6/2004 | Ezuka ........................... | 330/149 |
| 6,836,517 | B2 * | 12/2004 | Nagatani et al. ............. | 375/296 |
| 7,012,969 | B2 * | 3/2006 | Ode et al. ..................... | 375/296 |
| 7,415,250 | B2 * | 8/2008 | Sasaki et al. ............... | 455/114.2 |

(Continued)

FOREIGN PATENT DOCUMENTS

| | | |
|---|---|---|
| CN | 1450770 | 10/2003 |
| CN | 101023578 | 8/2007 |
| EP | 1199814 | 4/2002 |
| JP | 2005-142881 | 6/2005 |
| JP | 2005-217714 | 8/2005 |
| JP | 2005-244430 | 9/2005 |
| JP | 2007-19782 | 1/2007 |

OTHER PUBLICATIONS

The extended European search report issued for corresponding European application No. 10154569.7 dated Sep. 19, 2012.
First Notification of Office Action issued by the State Intellectual Property Office of China for corresponding Chinese Patent Application No. 201010122263.1 on Aug. 23, 2012. Full English machine translation attached.

*Primary Examiner* — Quochien B Vuong
(74) *Attorney, Agent, or Firm* — Myers Wolin, LLC

(57) ABSTRACT

A distortion compensation apparatus includes a distortion compensation signal generation unit that performs, on a transmission signal, distortion compensation processing using a series operation; a coefficient updating unit that updates series operation coefficients used for the series operation based on a feedback signal of a power amplification output which is output through power amplification processing of a distortion compensation signal output from the distortion compensation signal generation unit, and based on the distortion compensation signal; a memory that stores the distortion compensation signal corresponding to a transmission signal having a given power value and the feedback signal of the power amplification output as restraint information; and a control unit that performs control so that, in accordance with the power value of the transmission signal, restraint information corresponding to a power value different from the power value of the transmission signal is read and used for updating the series operation coefficients.

10 Claims, 14 Drawing Sheets

(56) References Cited

U.S. PATENT DOCUMENTS

| | | |
|---|---|---|
| 7,430,250 B2 * | 9/2008 | Shako et al. .................. 375/296 |
| 7,486,744 B2 * | 2/2009 | Shako et al. .................. 375/296 |
| 2001/0007435 A1 | 7/2001 | Ode et al. |
| 2003/0228856 A1 | 12/2003 | Orihashi et al. |
| 2005/0101254 A1 | 5/2005 | Sasaki et al. |
| 2005/0180527 A1 | 8/2005 | Suzuki et al. |
| 2005/0184803 A1 | 8/2005 | Hirose et al. |
| 2007/0008033 A1 | 1/2007 | Okazaki |
| 2008/0197925 A1 | 8/2008 | Furuta et al. |

\* cited by examiner

DISTORTION COMPENSATION APPARATUS AND METHOD

CROSS-REFERENCE TO RELATED APPLICATION

This application is based upon and claims the benefit of priority of the prior Japanese Patent Application No. 2009-47911, filed on Mar. 2, 2009, the entire contents of which are incorporated herein by reference.

FIELD

Embodiments of the present invention relate to a predistortion-based distortion compensation technique that, in digital wireless communication, digitally processes in advance a signal input to a transmission amplifier and suppresses nonlinear distortion of the transmission amplifier output.

BACKGROUND

In general, high efficiency transmission amplifiers used for wireless transmission apparatuses of mobile communications stations and the like have highly nonlinear characteristics. Hence, when a modulated signal for high-speed wireless communication is transmitted, such nonlinear distortion in transmission amplifiers causes out-of-band radiation power to be generated, influencing neighboring transmission channels.

In a typical transmission amplifier, the output becomes saturated with an increase in the input power, making it difficult to output a signal which is directly proportional to the input signal (refer to 1401 and 1402 illustrated in FIG. 14). Such a nonlinear characteristic of a transmission amplifier causes an unnecessary spectrum to be radiated outside of a signal band, for an input to the amplifier. This out-of-band radiation power causes the characteristics of other systems using the frequencies outside of the band to be degraded. In addition, an unnecessary spectrum is also radiated within the signal band. This causes the degradation in the characteristic of the signal itself.

Furthermore, since many of the recent digital modulation methods employ linear modulation, an amplifier having a nonlinear characteristic as described above is operated in a linear region which has low power efficiency so as to perform linear amplification.

As a method of suppressing out-of-band radiation caused by an amplifier, a predistortion technique is known in which the inverse characteristic of the amplifier is added in advance to an input signal to be input to the amplifier to compensate for the nonlinear distortion of the amplifier. This technique cancels distortion by distorting a signal in advance using a compensation signal generated based on the characteristic of the amplifier and then passing the signal through the amplifier. This allows the output signal of a transmission amplifier to have linearity (1401 illustrated in FIG. 14).

Furthermore, by using an adaptive predistortion method in which adaptive distortion compensation is performed by feedback of the output of an amplifier, optimal compensation is realized for the characteristic of the amplifier which varies among the individual differences of devices and varies with frequency, operation temperature, or the like.

FIG. 11 is a configuration diagram of an existing distortion compensation apparatus that uses an adaptive predistortion technique.

A predistortion signal generation unit 1102 within a distortion compensation unit 1101 adds, to a transmission signal, a compensation signal having the inverse characteristic of a transmission amplifier.

The output of the predistortion signal generation unit 1102, after being converted into an analog signal by a D/A converter (not illustrated), is upconverted by an orthogonal modulator 1107 to a carrier frequency using a signal output from a local oscillator 1108.

The modulator output signal is amplified by a power amplifier 1109 which is a transmission amplifier, and the output thereof is transmitted from a transmission antenna (not illustrated), via a coupler 1110. The output of the power amplifier 1109 is fed back from the coupler 1110 to the input side.

In other words, the output of the coupler 1110 is downconverted by a downconverter 1111 using a signal output from a local oscillator 1112. The output of the downconverter 1111 is passed through a filter 1113 and converted back into a digital signal by an A/D converter (not illustrated).

The resultant obtained feedback signal is input to an adaptive control unit 1103 that includes a predistortion signal generation unit 1104, an error computation unit 1105, and a coefficient updating unit 1106.

In the adaptive control unit 1103, the predistortion signal generation unit 1104 having the same configuration as the predistortion signal generation unit 1102 adds a signal for compensating for the nonlinear distortion characteristic of the transmission amplifier to the feedback signal.

The error computation unit 1105 computes the difference between the output of the predistortion signal generation unit 1102 and the output of the predistortion signal generation unit 1104, and outputs the difference as an error.

The coefficient updating unit 1106 updates the series operation coefficients to be set in the predistortion signal generation units 1102 and 1104 based on a convergence algorithm such as a least mean square (LMS) operation or the like so as to minimize the error signal output from the error computation unit 1105.

In this manner, the series operation coefficients are gradually made to converge to appropriate values, and the predistortion signal generation unit 1102 performs distortion compensation on an input signal x using these series operation coefficients having converged to the appropriate values. This allows the nonlinear characteristic of an analog circuit to be suppressed with high precision in a steady state, while maintaining power efficiency. Even when the nonlinear distortion characteristic changes due to the influence of temperature or frequency, the series operation coefficients are updated by the coefficient updating unit 1106 using the feedback signal so as to compensate for that change, thereby allowing a change in the characteristic to be dynamically compensated for.

As a method of distortion compensation used in the predistortion signal generation units 1102 and 1104, a predistortion method using a power series has been hitherto proposed. This is a method in which a compensation operation is performed by a series operation on a transmission signal x(t), as illustrated in FIG. 12.

A plurality of power operation units 1201 compute the powers of respective orders, such as the first power ($X^1$), second power ($X^2$), third power ($X^3$), . . . , and n-th power ($X^n$), for the transmission signal x(t).

A plurality of coefficient multiplication units 1202 multiply the computation results of respective orders by corresponding series operation coefficients.

The outputs of the coefficient multiplication units 1202 are added together by an addition unit 1203 so as to constitute a predistortion signal y(t), which is output by the predistortion signal generation unit 1102 or 1104.

The above-described power operation is executed, in digital signal processing, as arithmetic processing expressed by Equation (1) described below.

$$y(n) = \sum_{k=0}^{3} \sum_{l_1=0}^{1} \sum_{l_2=l_1}^{1} \sum_{l_3=l_2}^{1} \sum_{l_4=l_3}^{1} \sum_{l_5=l_4}^{1} h_{2k+1}(l_1, l_2, \cdots, l_{2k+1}) \prod_{i=1}^{k+1} x(n-l_i) \prod_{i=k+2}^{2k+1} x^*(n-l_i) \quad (1)$$

In Equation (1), x(n) denotes a transmission signal, h denotes series operation coefficients, and y(n) denotes a predistortion signal. Note that the above arithmetic processing is actually performed as processing for a complex signal.

When the distortion compensation processing in the predistortion signal generation units 1102 and 1104 is performed by a power series operation, as described above, the coefficient updating unit 1106 illustrated in FIG. 11 performs coefficient updating processing as follows. That is, the coefficient updating unit 1106 updates respective series operation coefficients (correction factors) h used in the predistortion signal generation units 1102 and 1104 such that the power series operation optimally approximates the nonlinear distortion amplification characteristic of the power amplifier 1109.

In this case, for the coefficient updating equations, such as those illustrated in FIG. 13, that are configured by using the error signal e(t) output from the error computation unit 1105, the coefficient updating unit 1106 updates respective series operation coefficients hi (i=1, 2, . . . , n), by executing a least mean square (LMS) algorithm for minimizing the error signal e(t). Here, μ denotes a step size parameter, and x(t), $x^2$(t), . . . , and $x^n$(t) denote the respective outputs of the power operation units 1201 illustrated in FIG. 12 within the predistortion signal generation unit 1102 or 1104.

FIG. 14 is a diagram illustrating the relationship between the amplifier characteristic of the power amplifier 1109 and the distortion compensation in the predistortion signal generation units 1102 and 1104, in the adaptive predistortion method of the existing distortion compensation apparatus using the above-described series operation.

The coefficient updating processing in the coefficient updating unit 1106 illustrated in FIG. 11 is performed so that the output power of a transmission signal at the time of updating each coefficient becomes optimum.

Referring to FIG. 14, it is assumed that the ideal amplifier characteristic of the power amplifier 1109 is a linear characteristic as denoted by 1401, and the actual amplifier characteristic is a nonlinear characteristic as denoted by 1402. In other words, regarding the amplifier characteristic 1402, there generally is a tendency for the amplification factor to become lower than that in the case of the ideal amplifier characteristic 1401 in a high-input-power range.

Here, the case is considered where the coefficient updating operation is performed when the input power (Ave-Peak) of a transmission signal is high, as illustrated as a range 1406 in FIG. 14. The distortion compensation curve corresponding to the power series operation using the respective operation coefficients obtained by this coefficient updating operation illustrates, for example, a characteristic denoted by 1403. This characteristic is represented by a curve that optimally compensates for the amplifier characteristic 1402 in the high-input-power range 1406.

On the other hand, the case is considered where the coefficient updating operation is performed when the input power (Ave-Peak) of a transmission signal is low, as illustrated as a range 1407. The distortion compensation curve corresponding to the power series operation using the respective operation coefficients obtained by this coefficient updating operation illustrates, for example, a characteristic denoted by 1404-1. This characteristic is an inverse characteristic that optimally compensates for the amplifier characteristic 1402 in the low-input-power range 1407.

Here, the case is considered where in a state in which the system is operating in the range 1406 in which the input signal power is high, a transmission signal having an input power in a range lower than the average power (Ave) of the range 1406 is input. In such a range, since the compensation curve 1403 at the time of high power is not significantly different from the compensation curve 1404-1 at the time of low power, the distortion compensation characteristic added to the transmission signal by the predistortion signal generation unit 1102 is close to optimal.

Conversely, the case is considered where in a state in which the system is operating in the range 1407 in which the input signal power is low, a transmission signal having an input power higher than the range 1407 is unexpectedly input. In the range 1407, the coefficient updating unit 1106 (FIG. 11) performs the coefficient updating processing without assuming a power higher than the range 1407. Hence, the compensation characteristic in the input power range 1405 higher than the peak power of the range 1407, is very likely to largely deviate from the inverse characteristic of the amplifier characteristic 1402, as illustrated by a compensation curve 1404-2 in FIG. 14. Consequently, in such a state, the distortion compensation characteristic added to a transmission signal becomes far from the optimal characteristic, thereby causing a high distortion power to be generated in the output of the power amplifier 1109, which causes the out-of-band radiation power characteristics to be degraded.

Thus, when a low-power transmission signal suddenly changes to a high-power transmission signal due to a power change, the existing technique does not allow distortion to be optimally canceled by using the series operation coefficients which have been generated up to that time.

SUMMARY

According to an aspect of the embodiments discussed herein, a distortion compensation apparatus includes a distortion compensation signal generation unit that performs, on a transmission signal, distortion compensation processing using a series operation; a coefficient updating unit that updates a group of series operation coefficients used for the series operation based on a feedback signal of a power amplification output which is output through power amplification processing of a distortion compensation signal output from the distortion compensation signal generation unit, and based on the distortion compensation signal; a memory that stores the distortion compensation signal corresponding to a transmission signal having a given power value and the feedback signal of the power amplification output as restraint information; and a control unit that performs control so that, in accordance with the power value of the transmission signal, specific restraint information corresponding to a power value different from the power value of the transmission signal is read from the memory and the specific restraint information is used for updating the group of series operation coefficients performed by the coefficient updating unit.

It is to be understood that both the foregoing general description and the following detailed description are exemplary and explanatory and are not restrictive of the embodiments, as claimed.

DESCRIPTION OF EMBODIMENTS

Figure 1:
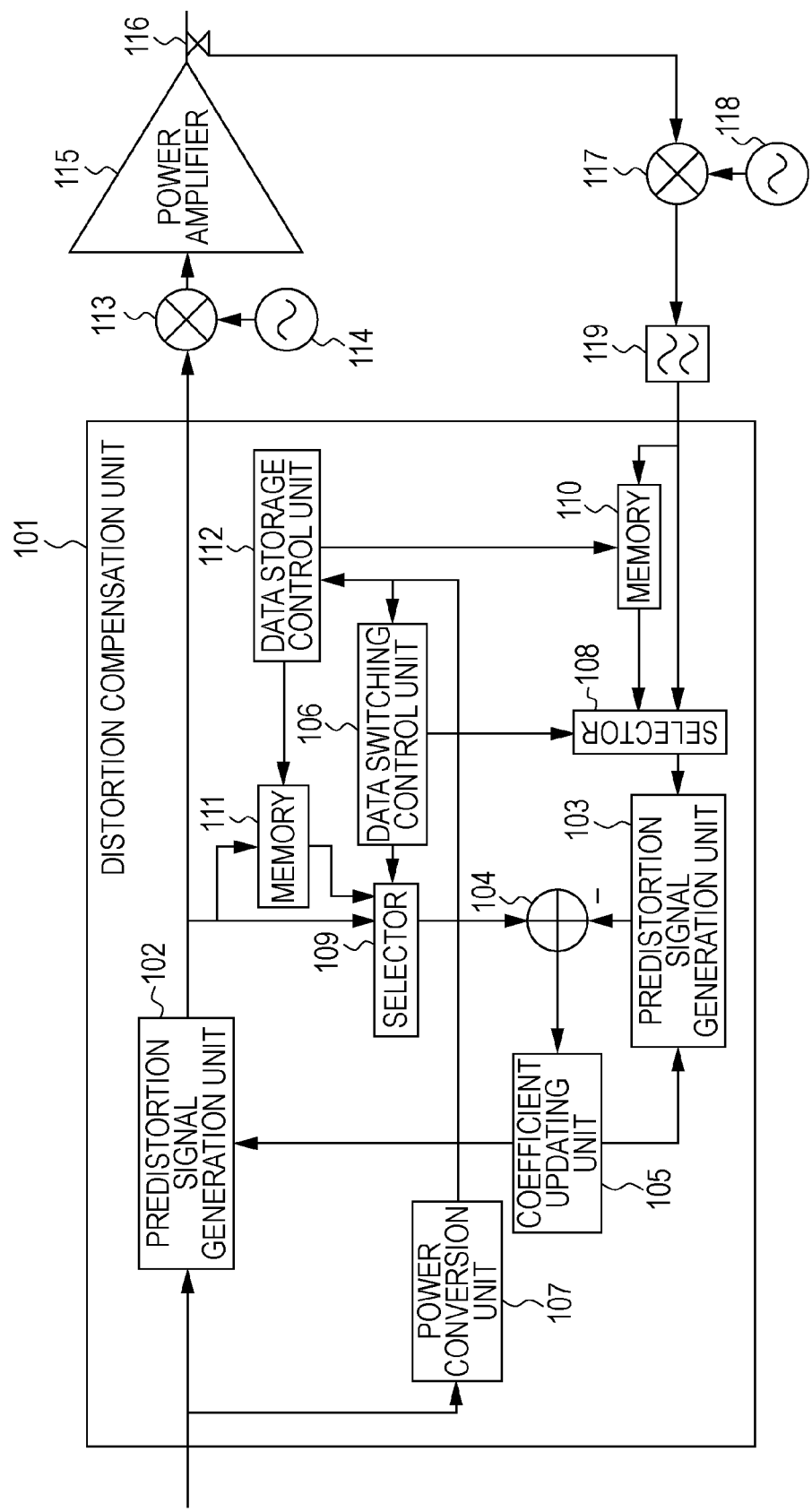
FIG. 1 is a configuration diagram of a distortion compensation apparatus according to a first embodiment that uses a predistortion method using a power series.

FIG. 1 is a configuration diagram of a distortion compensation apparatus that uses a predistortion method using a power series, according to a first embodiment.

A distortion compensation unit 101 includes predistortion signal generation units 102 and 103, an error computation unit 104, a coefficient updating unit 105, a data switching control unit 106, a power conversion unit 107, selectors 108 and 109, memories 110 and 111, and a data storage control unit 112.

The predistortion signal generation unit 102 within the distortion compensation unit 101 adds, to a transmission signal, a compensation signal having the inverse characteristic of a transmission amplifier, and outputs a distortion compensation signal (predistortion signal).

The predistortion signal output from the predistortion signal generation unit 102, after being converted into an analog signal by a D/A converter (not illustrated), is upconverted by an orthogonal modulator 113 to a carrier frequency using a signal output from a local oscillator 114.

The modulator output signal is amplified by a power amplifier 115 which is a transmission amplifier, and the output thereof (power amplification output) is supplied via a coupler 116 to a transmission antenna (not illustrated) and transmitted therefrom.

The output of the power amplifier 115 is also fed back via the coupler 116 to the input side.

The output of the coupler 116 is downconverted by a downconverter 117 using a signal output from a local oscillator 118. The output of the downconverter 117 is passed through a filter 119 and converted back into a digital signal by an A/D converter (not illustrated).

The resultant obtained feedback signal is input to the predistortion signal generation unit 103 via the selector 108.

The predistortion signal generation unit 103, having the same configuration as the predistortion signal generation unit 102, adds a compensation signal having the inverse characteristic of the nonlinear distortion characteristic of the transmission amplifier to the feedback signal having been converted to a digital signal or a signal output from the memory 110, input via the selector 108. In this manner, the second distortion compensation signal is output.

The error computation unit 104 computes the difference between the distortion compensation signal from the predistortion signal generation unit 102 or the distortion compensation signal from the memory 111 input via the selector 109 and the predistortion signal from the predistortion signal generation unit 103, and outputs the computed difference as an error.

The coefficient updating unit 105 updates a group of series operation coefficients to be set in the predistortion signal generation units 102 and 103 based on a least mean square (LMS) operation so as to reduce the error signal output from the error computation unit 104.

Figure 12:
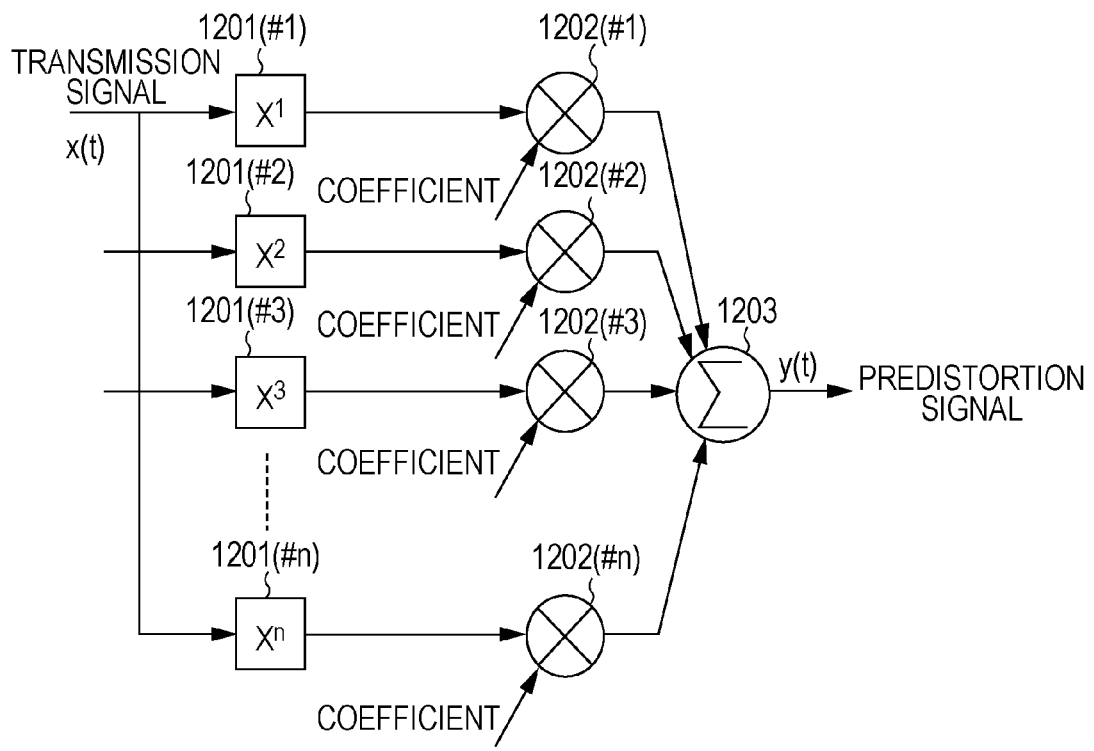
FIG. 12 is an explanatory diagram of a predistortion compensation method using a power series.
Figure 13:
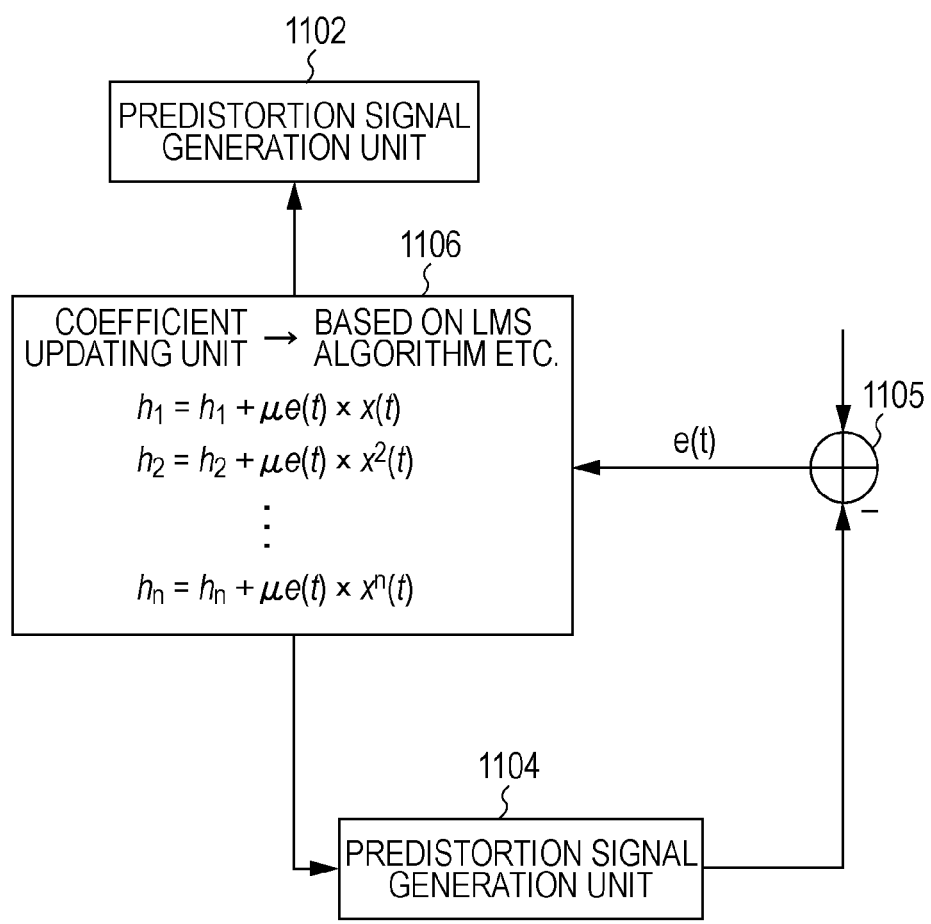
FIG. 13 is a diagram explaining processing for updating series operation coefficients.
Figure 14:
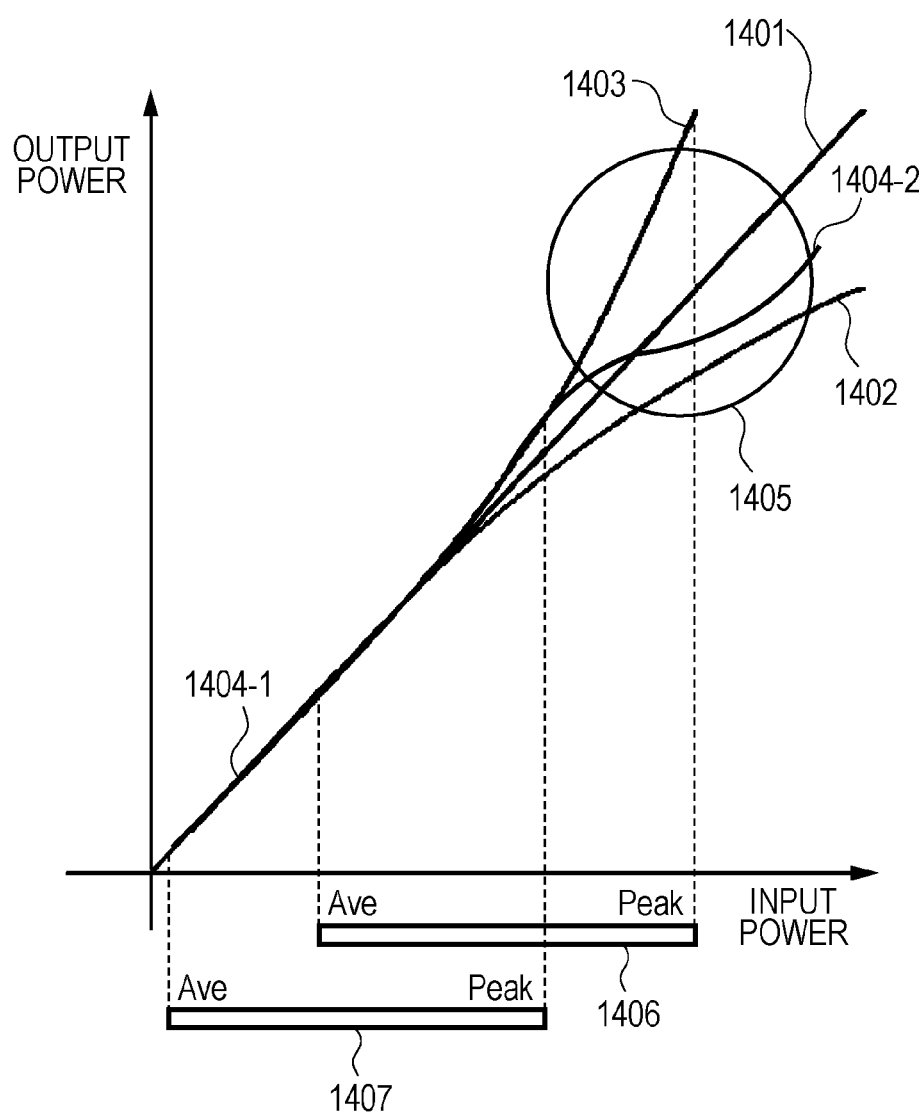
FIG. 14 is a diagram explaining issues of the existing technique.

The predistortion signal generation units 102 and 103 use a predistortion-based distortion compensation method using a power series. This is the same method as the previously described method illustrated in FIGS. 12 and 13.

In the coefficient updating unit 105, the series operation coefficients are gradually made to converge to appropriate values, and the predistortion signal generation units 102 and 103 perform distortion compensation on an input signal using the group of the series operation coefficients that have been converged to the appropriate values.

The power conversion unit 107 detects the input power of a transmission signal.

When the range, of the transmission signal input power, that is, the range from the average power to the peak power, detected by the power conversion unit 107 falls within a given low-power range, the data switching control unit 106 performs the following control operation. In a first given period of the coefficient updating processing, the data switching control unit 106 causes the selector 108 to select and output the feedback signal having been converted back into a digital signal, and causes the selector 109 to select and output the distortion compensation signal output by the predistortion signal generation unit 102. In a second given period of the coefficient updating processing, the data switching control unit 106 causes the selector 108 to read, select, and output the feedback signal stored in the memory 110, and causes the selector 109 to read, select, and output the distortion compensation signal stored in the memory 111.

Hence, in the first given period of the coefficient updating processing, the coefficient updating unit 105 performs a coefficient updating operation based on the predistortion signal generated from the feedback signal and the distortion compensation signal output by the predistortion signal generation unit 102. In the second given period of the coefficient updating processing, the coefficient updating unit 105 performs the coefficient updating operation based on the feedback signal stored in the memory 110 and the distortion compensation signal stored in the memory 111.

The data storage control unit 112 causes the memory 110 to selectively store a feedback signal and, in correspondence with this feedback signal, causes the memory 111 to store the distortion compensation signal output from the predistortion signal generation unit 102 in the memory 111.

The operation of the first embodiment of the distortion compensation apparatus having the configuration illustrated in FIG. 1 will be described below.

Figure 2:
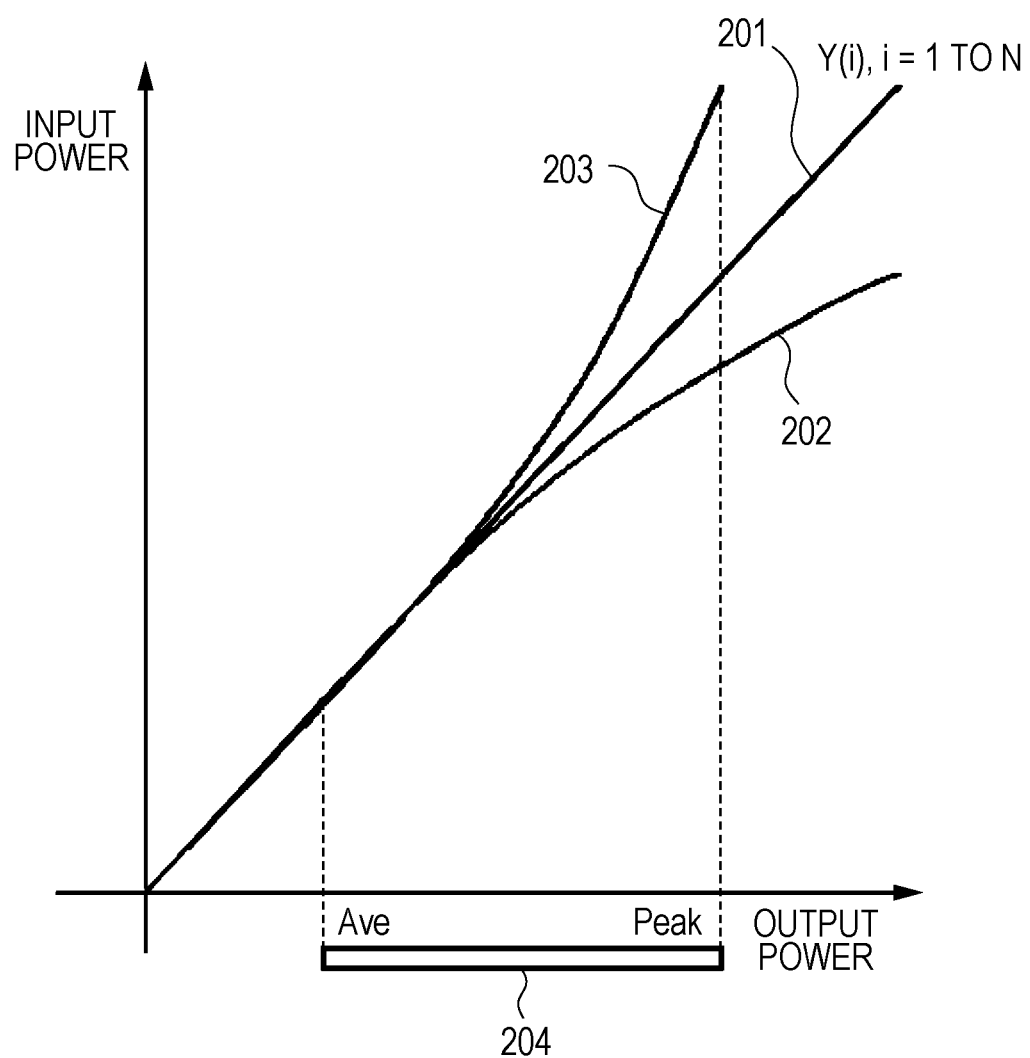
FIG. 2 is an explanatory diagram (1) of the first embodiment.

Referring to FIG. 2, it is assumed that an ideal amplifier characteristic of the power amplifier 115 is a linear characteristic denoted by 201, and the actual amplifier characteristic is a nonlinear characteristic denoted by 202.

Here, the case is considered where the coefficient updating operation is performed by the coefficient updating unit 105 when the input power (Ave-Peak) of a transmission signal is high, which is illustrated as a range 204 in FIG. 2. The distortion compensation curve corresponding to the power series operation using the respective operation coefficients obtained by this coefficient updating operation illustrates, for example, a characteristic denoted by 203. This characteristic is the inverse characteristic that optimally compensates for the amplifier characteristic 202 in the high-input-power range 204, and is capable of significantly compensating for the nonlinear amplifier characteristic, particularly in the high-input-power region.

Figure 3:
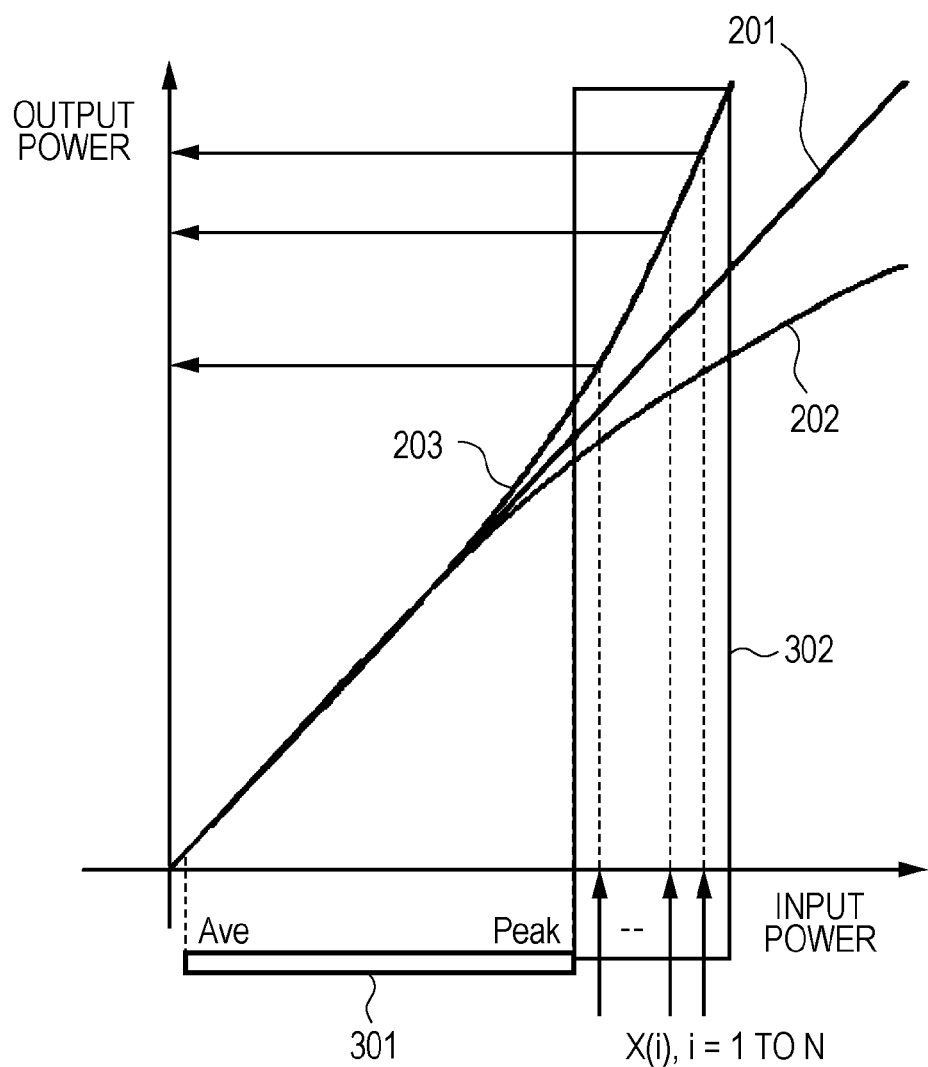
FIG. 3 is an explanatory diagram (2) of the first embodiment.

In the first embodiment, referring to FIG. 3, information stored as restraint information 302 in the memories 110 and 111 is used for information corresponding to a power above a low-input-power range 301 (Ave-Peak) of the transmission signal. The restraint information 302 is made up of a feedback signal of the power amplification output and a distortion compensation signal output from the predistortion signal generation unit 102 corresponding to the feedback signal. These signals are respectively stored in the memory 110 and the memory 111 by the data storage control unit 112. In the first embodiment, this storing operation is, for example, performed during a test process at the time of shipment from a factory. The restraint information 302 is a combination of the feedback signal and the distortion compensation signal which allows generation of a distortion compensation characteristic capable of compensating for a nonlinear amplifier characteristic 202 with high precision in a range where the input power is high.

Figure 4:
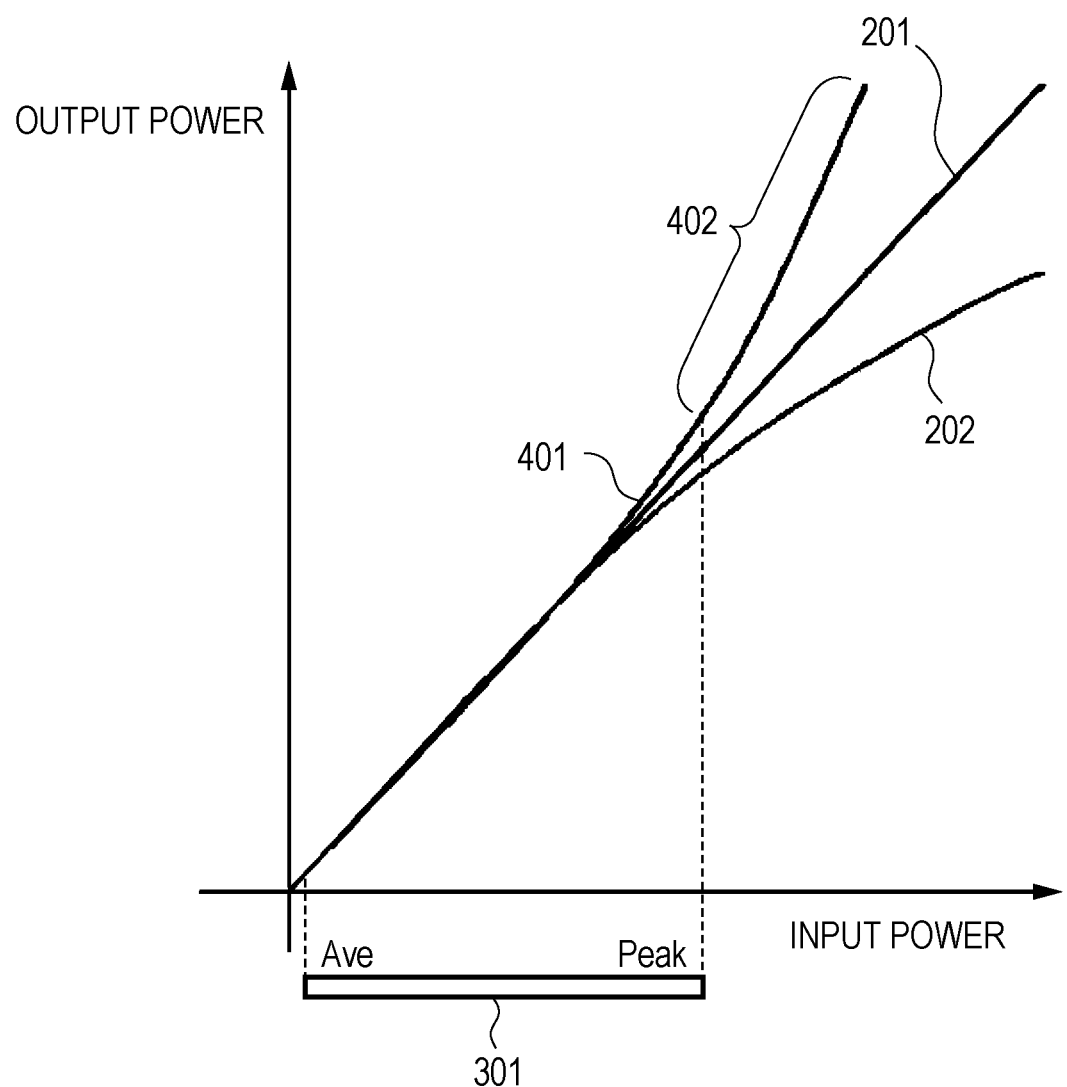
FIG. 4 is an explanatory diagram (3) of the first embodiment.

When the range of the transmission signal input power, that is, the range from the average power to the peak power, detected by the power conversion unit 107 falls within a low-input-power range denoted by 301 in FIG. 4, the data switching control unit 106 performs the following control operation.

That is, in the first given period of the coefficient updating processing, the data switching control unit 106 causes the selector 108 to select and output the feedback signal, and causes the selector 109 to select and output the distortion compensation signal output by the predistortion signal generation unit 102. Hence, the coefficient updating unit 105 performs a coefficient updating operation based on the predistortion signal generated by passing the feedback signal through the predistortion signal generation unit 103 and the distortion compensation signal output by the predistortion signal generation unit 102. By using the group of series operation coefficients updated by this coefficient updating operation, a low-power-time compensation curve 401 allowing for preferable distortion compensation in the low-power range 301 is realized.

In the second given period of the coefficient updating processing, the data switching control unit 106 causes the selector 108 to read, select, and output the feedback signal stored in the memory 110, and causes the selector 109 to read, select, and output the distortion compensation signal stored in the memory 111. Hence, in the second given period of the coefficient updating processing, the coefficient updating unit 105 performs a coefficient updating operation based on the predistortion signal generated from the feedback signal stored in the memory 110 and the distortion compensation signal stored in the memory 111. By using the group of series operation coefficients updated by this coefficient updating operation, a low-power-time compensation curve 402 allowing for preferable distortion compensation not only in the low-power range 301 but also in the high-power range beyond the low-power range 301 is realized.

In other words, in the state in which the system is operating in the range 301 (FIG. 4) where the input power of a transmission signal is low, the case is considered where a transmission signal having a high input power exceeding the peak power (Peak) is suddenly input. Even in this case, the predistortion signal generation unit 102 may perform distortion compensation by using the group of series operation coefficients that realizes both the compensation curves 401 and 402.

Figure 5:
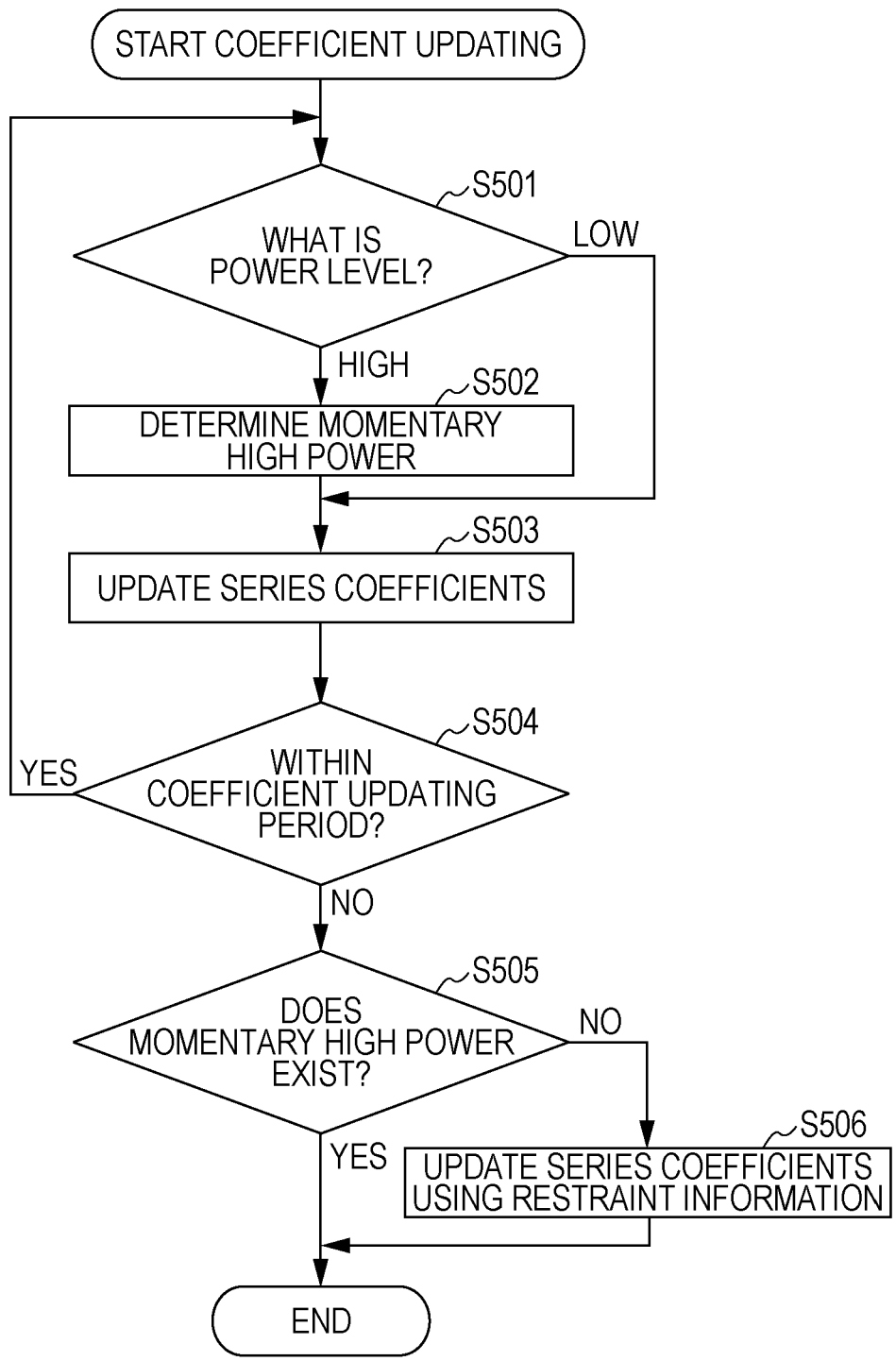
FIG. 5 is a flowchart of a coefficient updating operation periodically performed by the coefficient updating unit in FIG. 1 according to the first embodiment.
Figure 6:
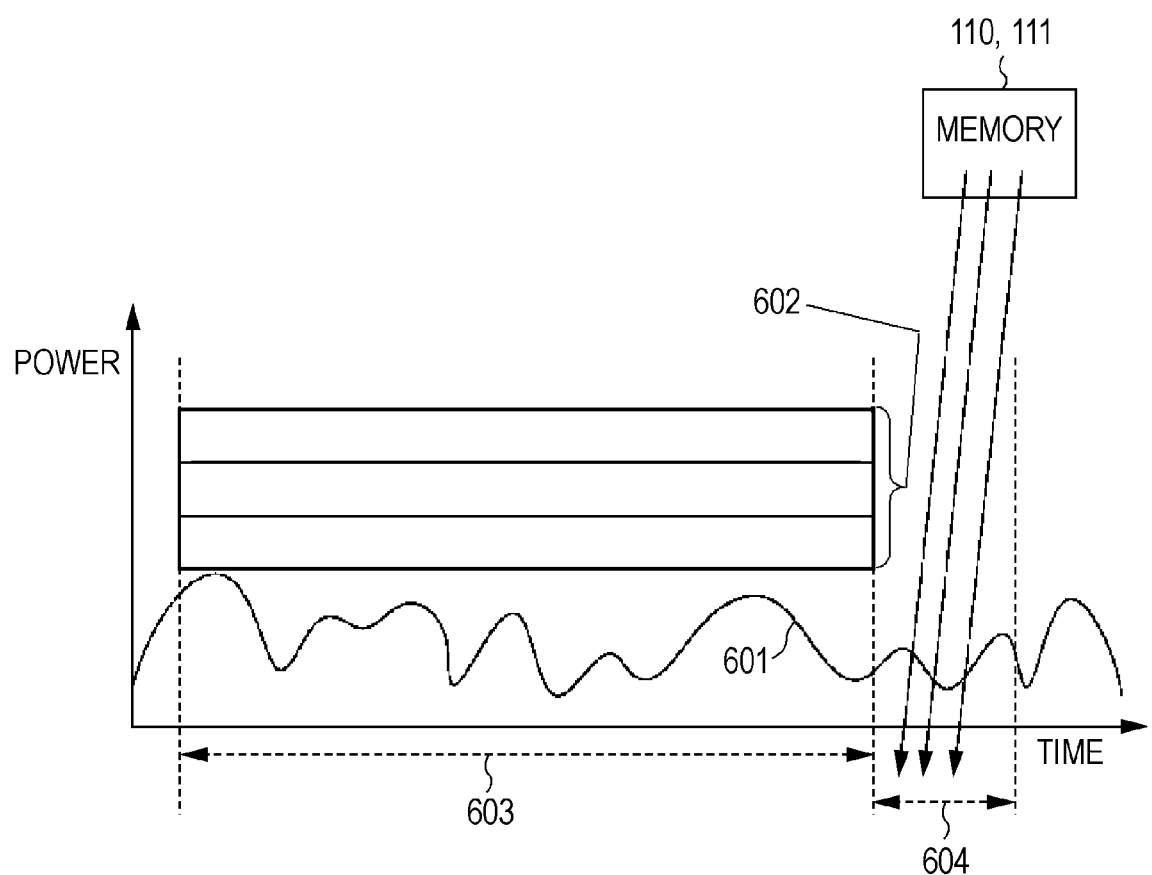
FIG. 6 is a diagram for explaining the coefficient updating operation periodically performed by the coefficient updating unit in FIG. 1 according to the first embodiment

FIG. 5 is a flowchart of a coefficient updating operation periodically performed by the coefficient updating unit 105 in FIG. 1 according to the first embodiment, and FIG. 6 is a diagram for explaining the operation.

The coefficient updating unit 105 determines the level of the power of a transmission signal by monitoring the output of the power conversion unit 107 (step S501).

When it is determined in step S501 that the power of the transmission signal is lower than a given value, the coefficient updating unit 105 performs processing for updating series operation coefficients using an LMS algorithm or the like (step S503).

Then, the coefficient updating unit 105 determines whether or not a coefficient updating period 603 in FIG. 6, for example, has been exceeded (step S504).

When the coefficient updating period 603 has not been exceeded, the control goes back to the processing of step S501, and the coefficient updating unit 105 continues the coefficient updating processing. The coefficient updating period 603 corresponds to the first given period in the coefficient updating processing described above.

When it is determined in step S501 that the power of the transmission signal is equal to or higher than a given value, the coefficient updating unit 105 further determines whether or not momentary high power is being generated (step S502). In other words, the coefficient updating unit 105 determines whether the current state of the transmission signal is a high-power input state as illustrated as the range 204 in FIG. 2 or a low-power input state as illustrated as the range 301 in FIG. 4. That is, the coefficient updating unit 105 determines whether a transmission signal 601 is within a range 602 or below the range 602, as illustrated in FIG. 6.

The coefficient updating unit 105 performs processing for updating series operation coefficients using an LMS algorithm or the like (step S503). When the coefficient updating period 603 in FIG. 6, for example, has not been exceeded, the control goes back to the processing of step S501, and the coefficient updating unit 105 continues the coefficient updating processing.

When the processing enters a period 604 beyond the coefficient updating period 603 in FIG. 6, the coefficient updating unit 105 determines whether the coefficient updating has been performed when a transmission signal is in the high-power input state or low-power input state based on the determination result in step S502 (steps S504→S505). The period 604 corresponds to the above-described second given period in the coefficient updating processing.

In the case where the coefficient updating processing has been performed when a transmission signal is in the high-power input state, the coefficient updating unit 105 ends the coefficient updating processing.

In the case where the coefficient updating processing has been performed when a transmission signal is in the low-power-input state, the coefficient updating unit 105 performs processing indicated by the period 604 in FIG. 6. In other words, in the period 604, as described above, the data switching control unit 106 causes the selector 108 to read, select, and output the feedback signal stored in the memory 110, and causes the selector 109 to read, select, and output the distortion compensation signal stored in the memory 111. Hence, the predistortion signal generation unit 103 generates a distortion compensation signal corresponding to the feedback signal of the high-power range read from the memory 110 and inputs the signal to the error computation unit 104. Also the distortion compensation signal is input to the error computation unit 104, the distortion compensation signal being read from the memory 111 and corresponding to the feedback signal of the above high-power range generated by the predistortion signal generation unit 102. As a result, the error computation unit 104 outputs the error signal of the distortion compensation signal in the high-power region. The coefficient updating unit 105 updates the coefficients using this error signal (step S506)

After that, the coefficient updating unit 105 ends the coefficient updating processing.

Based on the above control operation, the coefficient updating unit 105 may perform the coefficient updating operation corresponding to the time of high-power output as well as the coefficient updating operation corresponding to the time of low-power output. Hence, even when a high-power transmission signal is input at the time of low-power output due to a variation in power, a group of series operation coefficients that may desirably cancel or reduce the nonlinear distortion in power amplification is generated.

Figure 7:
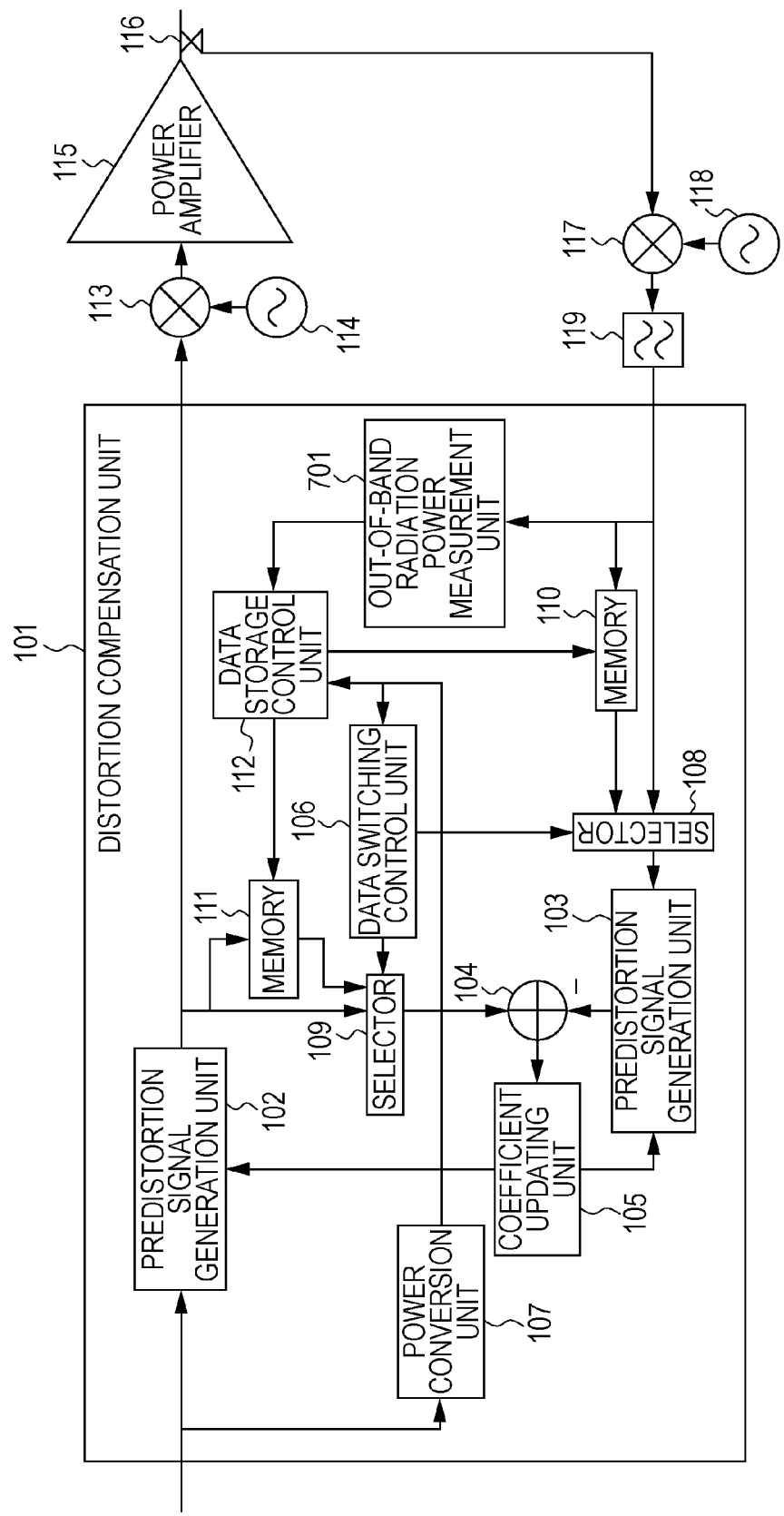
FIG. 7 is a configuration diagram of a distortion compensation apparatus according to a second embodiment that uses a predistortion method using a power series.

FIG. 7 is a configuration diagram of a distortion compensation apparatus according to a second embodiment that uses a predistortion method using a power series. Components performing the same processing as in the first embodiment illustrated in FIG. 1 are denoted by the same reference numerals as those in FIG. 1.

Unlike the configuration illustrated in FIG. 1, the configuration illustrated in FIG. 7 is provided with an out-of-band radiation power measurement unit 701 for measuring out-of-band radiation power of a feedback signal. In the first embodiment, the data storage control unit 112 stores restraint information in the memories 110 and 111 only at the time of shipment from a factory. However, in the second embodiment, the data storage control unit 112 may update the restraint information in the memories 110 and 111 when the power conversion unit 107 has detected input of a high-power transmission signal and the out-of-band radiation power measurement unit 701 has measured an out-of-band radiation power equal to or lower than a given value.

Figure 8:
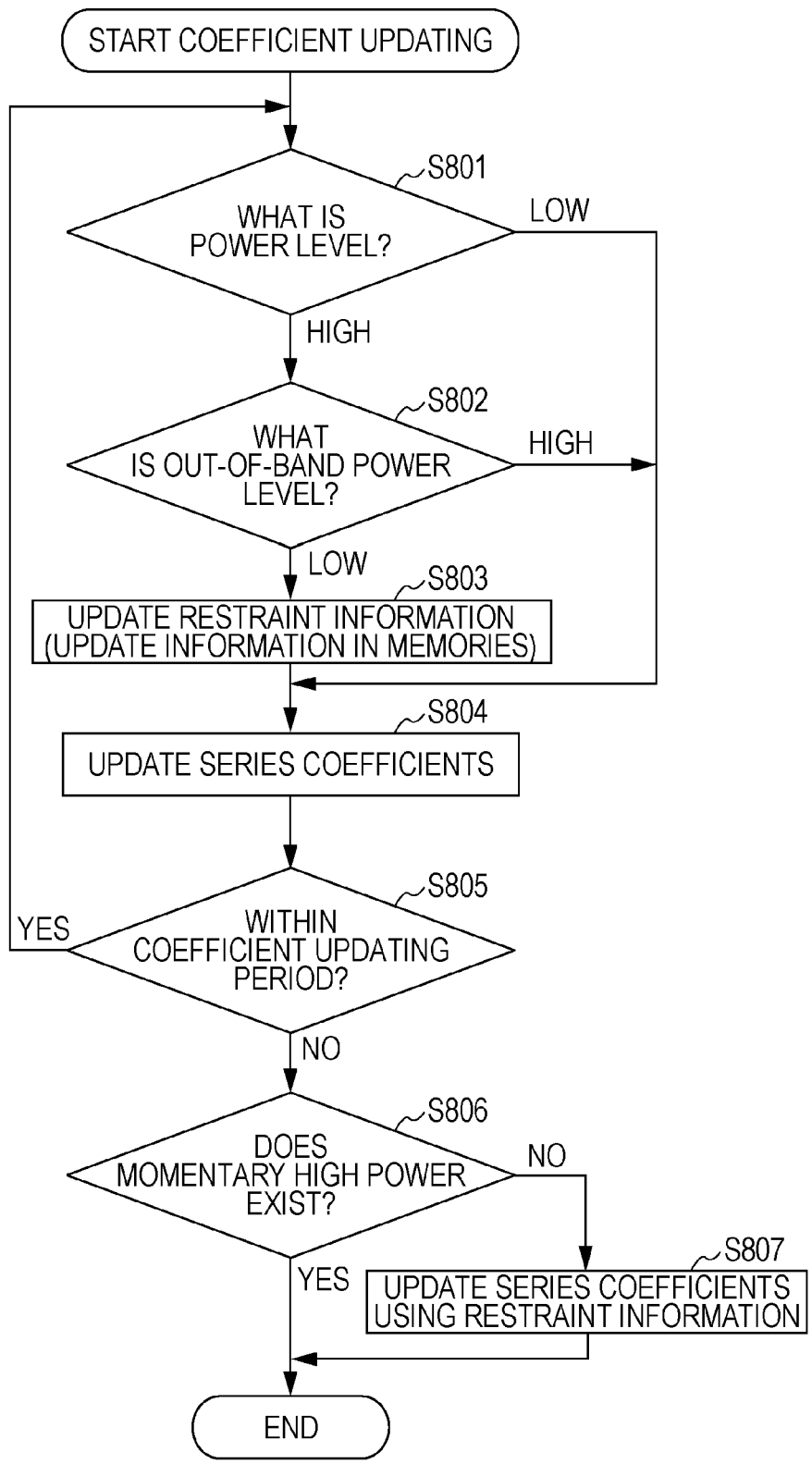
FIG. 8 is a flowchart of a coefficient updating operation periodically performed by the coefficient updating unit in FIG. 7 according to the second embodiment.
Figure 9:
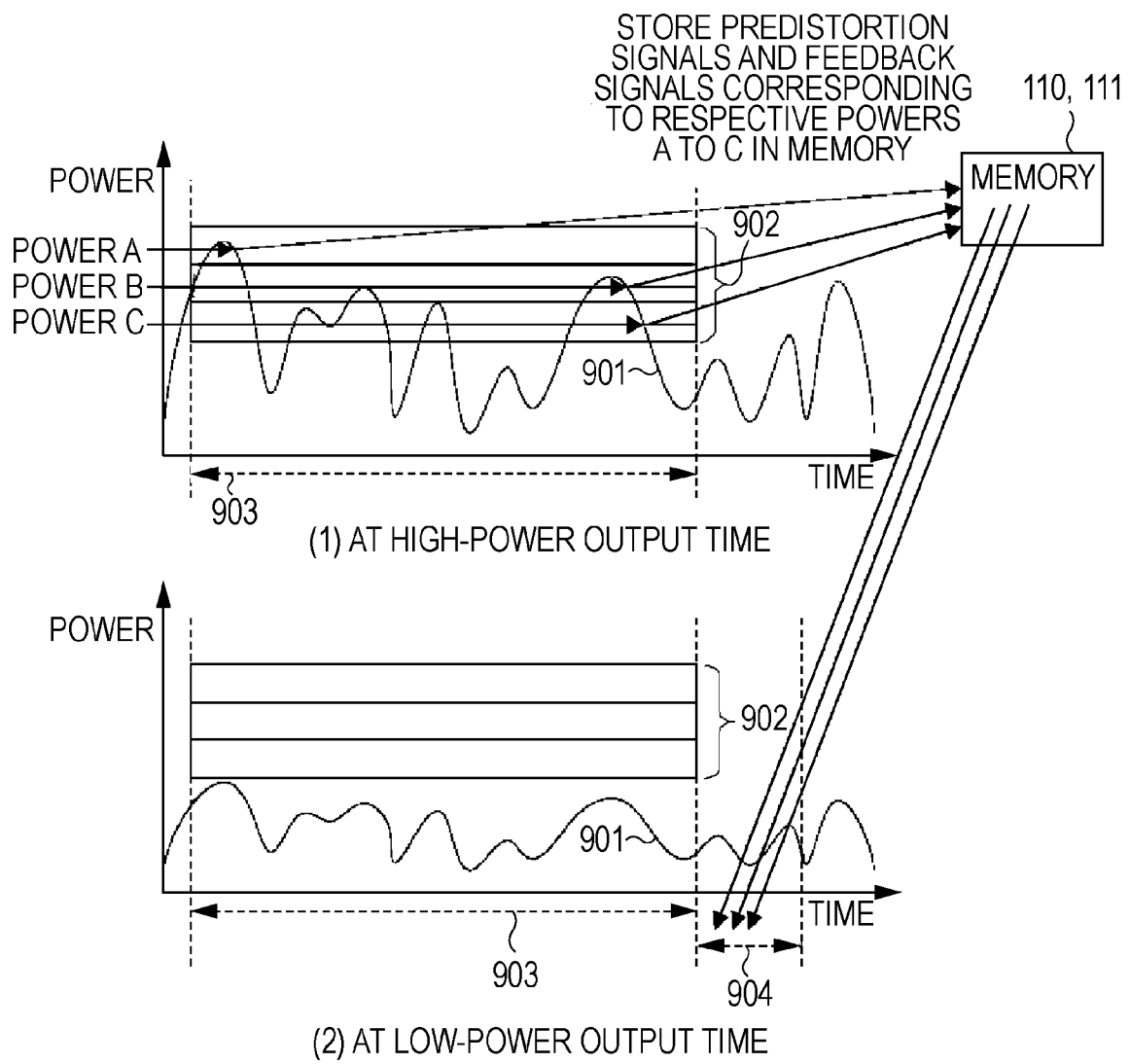
FIG. 9 is a diagram for explaining the coefficient updating operation periodically performed by the coefficient updating unit in FIG. 7 according to the second embodiment.

FIG. 8 is a flowchart of a coefficient updating operation periodically performed by the coefficient updating unit 105 in FIG. 7 according to the second embodiment, and FIG. 9 is a diagram for explaining the operation.

The coefficient updating unit 105 determines the level of the power of a transmission signal by monitoring the output of the power conversion unit 107 (step S801).

When it is determined in step S801 that the power of the transmission signal is lower than a given value, the coefficient updating unit 105 performs processing for updating series operation coefficients using an LMS algorithm or the like (step S804).

Then, the coefficient updating unit 105 determines whether or not a coefficient updating period denoted by 903 in FIG. 9, for example, has been exceeded (step S805).

When the coefficient updating period 903 has not been exceeded, the control goes back to the processing of step S801, and the coefficient updating unit 105 continues the coefficient updating processing. The coefficient updating period 903 corresponds to the first given period in the coefficient updating processing described in the above-described first embodiment.

When it is determined in step S801 that the power of the transmission signal is equal to or higher than a given value, the coefficient updating unit 105 further determines the level of an out-of-band radiation power measured by the out-of-band radiation power measurement unit 701.

When it is determined that the out-of-band radiation power is equal to or higher than a given value, the coefficient updating unit 105 performs the above-described coefficient updating processing of step S804.

When it is determined that the out-of-band radiation power is lower than a given value, the coefficient updating unit 105 issues an instruction to the data storage control unit 112 to update the restraint information, judging that a high precision distortion compensation signal is being obtained (step S803). Hence, the data storage control unit 112 stores the feedback signal in the memory 110 and the corresponding distortion compensation signal output from the predistortion signal generation unit 102 in the memory 111. In this manner, the restraint information in the memories 110 and 111 is updated.

After that the coefficient updating unit 105 performs the above-described coefficient updating processing of step S804.

In this manner, the restraint information is updated by the data storage control unit 112 so as to correspond to the latest state of the system, whereby the system may deal with, for example, the long-term change in the distortion compensation characteristic during the high power period.

When the processing enters a period 904 beyond the coefficient updating period 903 in FIG. 9, the coefficient updating unit 105 determines whether the coefficient updating has been performed when a transmission signal is in the high-power input state or low-power input state based on the output of the power conversion unit 107 (steps S805 to S806). The period 904 corresponds to the second given period in the coefficient updating processing described in the first embodiment.

In the case where the coefficient updating processing has been performed when a transmission signal in the high-power input state, the coefficient updating unit 105 ends the coefficient updating processing.

In the case where the coefficient updating processing has been performed when a transmission signal is in the low-power input state, the coefficient updating unit 105 performs processing indicated by the period 904 in FIG. 9. In other words, in the period 904, as described in the first embodiment, the data switching control unit 106 causes the selector 108 to read, select, and output the feedback signal stored in the memory 110, and causes the selector 109 to read, select, and output the distortion compensation signal stored in the memory 111. Hence, the predistortion signal generation unit 103 generates a distortion compensation signal corresponding to the feedback signal of the high-power range read from the memory 110 and inputs the signal to the error computation unit 104. Also the distortion compensation signal is input to the error computation unit 104, the distortion compensation signal being read from the memory 111 and corresponding to the feedback signal of the above high-power range generated by the predistortion signal generation unit 102. As a result, the error computation unit 104 outputs the error signal of the distortion compensation signal in the high-power region. The coefficient updating unit 105 updates the coefficients using this error signal (step S807)

After that, the coefficient updating unit 105 ends the coefficient updating processing.

Based on the above control operation, the second embodiment, in addition to the advantage in the first embodiment, allows the restraint information for high-power transmission that becomes a reference at the time of low-power transmission to be appropriately updated.

In the above-described second embodiment, as illustrated in FIG. 9, when the power of a transmission signal 901 exceeds a given value and the out-of-band radiation power is low, the following configuration may be employed. That is, as illustrated by reference numeral 902 in FIG. 9, the power range is divided into a plurality of subranges, and the restraint information (feedback signal and distortion compensation signal) is stored in the memories 110 and 111 individually for each subrange. In this case, the data switching control unit 106 causes the selector 109 and the memory 110 to select and output restraint information corresponding to the current power subranges.

Figure 10:
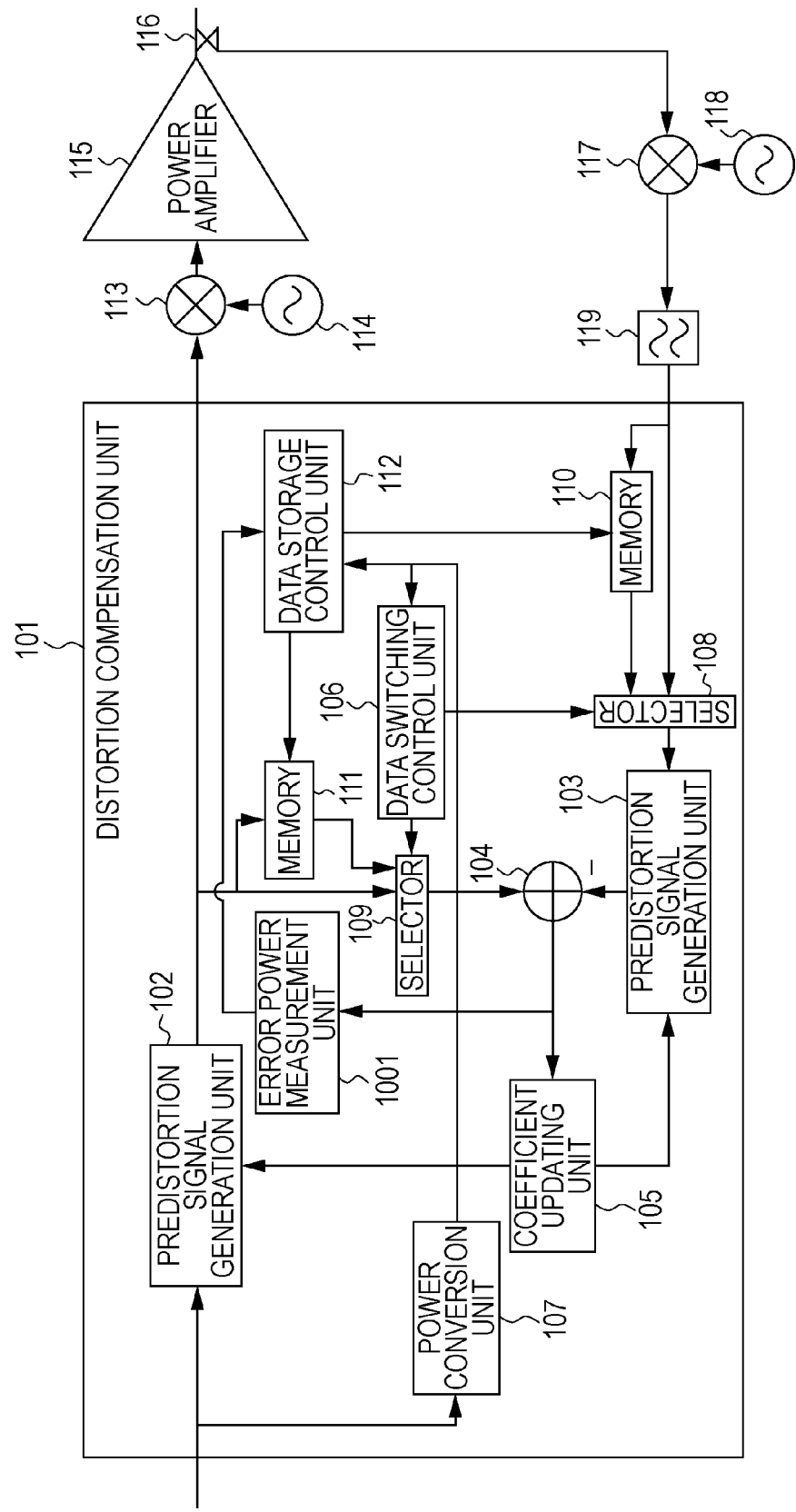
FIG. 10 is a configuration diagram of a distortion compensation apparatus according to a third embodiment that uses a predistortion method using a power series.
Figure 11:
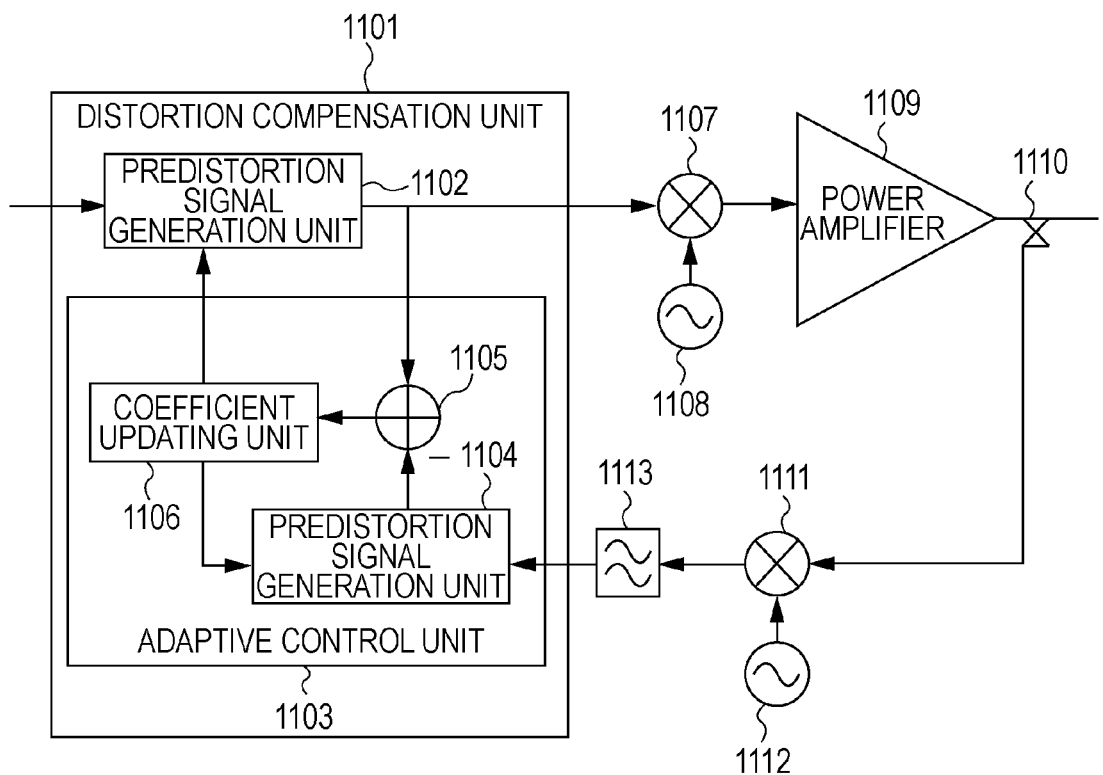
FIG. 11 is a configuration diagram of an existing distortion compensation apparatus that uses an adaptive predistortion technique.

FIG. 10 is a configuration diagram of a distortion compensation apparatus according to a third embodiment that uses a predistortion method using a power series. Components performing the same processing as in the first embodiment illustrated in FIG. 1 are denoted by the same reference numerals as those in FIG. 1.

Unlike the configuration illustrated in FIG. 1, the configuration illustrated in FIG. 10 is provided with an error power measurement unit 1001 for measuring the power of an error signal output from the error computation unit 104. In the second embodiment described above, the data storage control unit 112 updates the restraint information in the memories 110 and 111 when the power conversion unit 107 has detected input of a high-power transmission signal and the out-of-band radiation power measurement unit 701 has measured an out-of-band radiation power equal to or lower than a given value. However, in the third embodiment, the data storage control unit 112 updates the restraint information in the memories 110 and 111 when the power conversion unit 107 has detected input of a high-power transmission signal and the error power measurement unit 1001 has measured an error power equal to or lower than a given value.

In other words, the third embodiment has a configuration in which the out-of-band radiation power measurement unit 701 in the second embodiment is replaced with the error power measurement unit 1001.

The operation of the third embodiment is the same as that of the second embodiment except that the out-of-band radiation power measurement unit 701 is replaced with the error power measurement unit 1001. In this case, the configuration of the error power measurement unit 1001 may be made simpler than that of the out-of-band radiation power measurement unit 701.

According to the above-described embodiments, the coefficient updating unit 105 is not only capable of performing a coefficient updating operation at the time of a low-power output but also capable of performing a coefficient updating operation corresponding to the time of a high-power output, and hence, is capable of generating a group of series operation coefficients that may cancel the nonlinear distortion of a power amplifier even when a high-power transmission signal is input due to a variation in power during a low-power output. This allows an out-of-band radiation power to be suppressed within specification.

Hence, according to the above-described embodiments, the nonlinear distortion of a power amplifier may be cancelled or suppressed even when a low-power operation changes to a high-power operation due to a variation in power.

The above-described embodiments may be used for digital wireless transmission equipment and the like in digital wireless communications stations and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A distortion compensation apparatus comprising:
a distortion compensation signal generation unit that performs, on a transmission signal, distortion compensation processing using a series operation;
a coefficient updating unit that updates a group of series operation coefficients used for the series operation, based on a feedback signal of a power amplification output which is output through power amplification processing of a distortion compensation signal output from the distortion compensation signal generation unit, and based on the distortion compensation signal;
a memory that stores the distortion compensation signal corresponding to a transmission signal having a given power value and the feedback signal of the power amplification output, as restraint information; and
a control unit that performs control so that, in accordance with the power value of the transmission signal, specific restraint information corresponding to a power value different from the power value of the transmission signal is read from the memory, and the specific restraint information is used for updating the group of series operation coefficients performed by the coefficient updating unit.

2. The distortion compensation apparatus according to claim 1, further comprising:
a second distortion compensation signal generation unit that is different from the distortion compensation signal generation unit and performs, on the feedback signal of the power amplification output, the distortion compensation processing using the series operation; and
an error computation unit that computes an error between a second distortion compensation signal output from the second distortion compensation signal generation unit and the distortion compensation signal output from the distortion compensation signal generation unit,
wherein the coefficient updating unit, in accordance with the error output from the error computation unit, updates respective groups of series operation coefficients used for the distortion compensation signal generation unit and the second distortion compensation signal generation unit, and wherein the control unit, in accordance with the power value of the transmission signal, causes the coefficient updating unit to operate so that restraint information corresponding to a power value different from the power value of the transmission signal is read and a feedback signal included in the restraint information is input to the second distortion compensation signal generation unit, a distortion compensation signal included in the restraint information is input to the error computation unit, and the coefficient updating unit operates based on a resultant error output from the error computation unit.

3. The distortion compensation apparatus according to claim 1, wherein the memory stores, as the restraint information, the distortion compensation signal and the feedback signal of the power amplification output corresponding to a period when the power value of the transmission signal is equal to or higher than a given value, and wherein the control unit reads the restraint information from the memory and provides the restraint information to the coefficient updating unit when the power value of the transmission signal is lower than the given value.

4. The distortion compensation apparatus according to claim 1, wherein, for each of a given number of power subranges into which a power range of the transmission signal has been divided, the memory stores, as the restraint information, the distortion compensation signal and the feedback signal of the power amplification output corresponding to a period when the power value of the transmission signal falls within the respective subranges, and wherein the control unit reads the restraint information in the respective power subranges equal to or higher than the given value from the memory and provides the restraint information to the coefficient updating unit, when the power value of the transmission signal is lower than the given value.

5. The distortion compensation apparatus according to claim 1, further comprising a restraint information updating unit that updates the restraint information in the memory when an out-of-band power value of the power amplification output is lower than a given value, or when an error between a second distortion compensation signal generated from the feedback signal of the power amplification output and the distortion compensation signal is less than a given value.

6. A distortion compensation method comprising:

performing, on a transmission signal, distortion compensation processing using a series operation;

updating a group of series operation coefficients used for the series operation based on a feedback signal of a power amplification signal which is output through power amplification processing performed on a distortion compensation signal output which is output by the distortion compensation processing, and based on the distortion compensation signal;

storing, in a memory, the distortion compensation signal corresponding to a transmission signal having a given power value and the feedback signal of the power amplification signal, as restraint information; and performing restraint information control so that, in accordance with the power value of the transmission signal, specific restraint information corresponding to a power value different from the power value of the transmission signal is read from the stored restraint information, and the specific restraint information is used for updating the group of series operation coefficients.

7. The distortion compensation method according to claim 6, further comprising:

performing, on the feedback signal of the power amplification output, second distortion compensation processing different from the distortion compensation processing, using the series operation; and computing an error between a second distortion compensation signal output from the second distortion compensation processing and the distortion compensation signal output from the distortion compensation processing, wherein the updating of a group of series operation coefficients, in accordance with the error output from the error computation, includes updating the groups of series operation coefficients used for the series operation in the distortion compensation processing and the second distortion compensation processing, and wherein the restraint information control, in accordance with the power value of the transmission signal, includes causing reading of the restraint information corresponding to a power value different from the power value of the transmission signal from the memory, using a feedback signal included in the restraint information in the second distortion compensation processing, using a distortion compensation signal included in the restraint information in the error computation, and updating the groups of series operation coefficients based on a resultant error output from the error computation.

8. The distortion compensation method according to claim 6, wherein the storing of the restraint information includes storing, as the restraint information, the distortion compensation signal and the feedback signal of the power amplification output corresponding to a period when the power value of the transmission signal is equal to or higher than a given value, and wherein the restraint information control includes reading the restraint information from the memory and providing the restraint information to the coefficient updating when the power value of the transmission signal is lower than the given value.

9. The distortion compensation apparatus according to claim 6, wherein the storing of the restraint information includes storing, for each of a given number of power subranges into which a power range of the transmission signal has been divided, the distortion compensation signal and the feedback signal of the power amplification output corresponding to a period when the power value of the transmission signal falls within the respective subranges, as the restraint information, and wherein the restraint information control includes reading the restraint information in the respective subranges equal to or higher than a given level from the memory and providing the restraint information to the coefficient updating when the power value of the transmission signal is lower than the given value.

10. The distortion compensation method according to claim 6, wherein the restraint information in the memory is updated when an out-of-band power value of the power amplification output is lower than a given value, or when an error between a second distortion compensation signal generated from the feedback signal of the power amplification output and the distortion compensation signal is less than a given value.

* * * * *